United States Patent
Park et al.

(10) Patent No.: US 6,927,126 B2
(45) Date of Patent: Aug. 9, 2005

(54) METHOD OF MANUFACTURING SEMICONDUCTOR DEVICE WITH INTERCONNECTIONS AND INTERCONNECTION CONTACTS AND A DEVICE FORMED THEREBY

(75) Inventors: Je-Min Park, Kyunggi-do (KR);
Seung-young Son, Kyunggi-do (KR);
Yoo-Sang Hwang, Kyunggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/830,941

(22) Filed: Apr. 22, 2004

(65) Prior Publication Data

US 2004/0219777 A1 Nov. 4, 2004

(30) Foreign Application Priority Data

May 1, 2003 (KR) .................................. 10-2003-0028004

(51) Int. Cl.[7] .......................................... H01L 21/8242
(52) U.S. Cl. ...................................... 438/253; 438/595
(58) Field of Search ................................ 438/253, 256, 438/396, 399, 595

(56) References Cited

U.S. PATENT DOCUMENTS 6,261,964 B1 * 7/2001 Wu et al. .................... 438/705
6,511,879 B1 * 1/2003 Drynan ........................ 438/253
6,602,773 B2 * 8/2003 Lee et al. .................... 438/586
6,649,510 B2 * 11/2003 Lee ............................ 438/618

FOREIGN PATENT DOCUMENTS

KR  1020020088980  11/2002

OTHER PUBLICATIONS

English language abstract of Korean Publication No. 1020020088980.

* cited by examiner

Primary Examiner—Chandra Chaudhari
(74) Attorney, Agent, or Firm—Marger Johnson & McCollom, P.C.

(57) ABSTRACT

A second insulating layer is formed on a first insulating layer. A plurality of stacks each including a bit line and a bit line mask are formed on the second insulating layer. A third insulating layer is formed overlying the second insulating layer to fill gaps between the plurality of stacks. A hard mask layer is formed on the third insulating layer. A photoresist pattern is formed on the hard mask layer. The photoresist pattern has an opening region that intersects the plurality of stacks. The hard mask layer and the third insulating layer are sequentially etched, using the photoresist pattern as an etching mask, thereby forming a hard mask pattern and forming a recess in the third insulating layer. The recess exposes a portion of upper sidewalls of the bit line mask. Spacers are formed on the exposed upper sidewalls of the bit line mask.

18 Claims, 10 Drawing Sheets

METHOD OF MANUFACTURING SEMICONDUCTOR DEVICE WITH INTERCONNECTIONS AND INTERCONNECTION CONTACTS AND A DEVICE FORMED THEREBY

This application claims the priority of Korean Patent Application No. 2003-28004, filed on May 1, 2003, in the Korean Intellectual Property Office, the disclosure of which is incorporated herein by reference in their entirety.

BACKGROUND OF THE INVENTION

1. Field of the Invention

The present invention relates to semiconductor devices, and more particularly, to a method of manufacturing a semiconductor device with interconnection contacts, which are formed by perpendicularly penetrating an insulating layer disposed between interconnections such as bit lines and to a device formed thereby.

2. Description of the Related Art

As semiconductor devices become more highly integrated, design rules are being scaled down. In particular, the contact size of DRAMs is decreasing with a higher integration density of semiconductor devices. However, to manufacture semiconductor devices, misalignment margin must be held at a certain level in a photolithography process. For this reason, forming reliable interconnection contacts becomes more complicated. In the sub-0.14 µm-regime, it becomes more difficult to form interconnection contacts, which penetrate gaps between interconnections such as bit lines, to be sufficiently insulated from the bit lines. To solve problems of interconnection contacts, for example, a short between a buried contact (BC) and a bit line, a variety of techniques were proposed. For example, a method of forming interconnection contacts using a self-aligned contact (SAC) process has proposed. Nevertheless, these new techniques require additional process steps and result in a big increase in loading capacitance between bit lines. The big increase in loading capacitance may degrade characteristics of semiconductor devices seriously and thus must be preferably suppressed.

The big increase in loading capacitance occurs due to, for example, silicon nitride spacers, which are formed on sides of bit lines when the SAC process is adopted. Since silicon nitride has a much higher dielectric constant than silicon oxide, which is typically used to insulate semiconductor devices, it allows loading capacitance to greatly increase. While it is possible to replace silicon nitride spacers with silicon oxide spacers, if this is done, it is difficult to obtain a desired profile. This also makes it difficult to secure a sufficient distance for electric insulation between bit lines and interconnection contacts.

The increase in loading capacitance, a reduced design rule and a much higher height of a stack of bit lines can cause serious problems. As the height of the stack of bit lines increases, the aspect ratio between the bit lines becomes larger and larger. Thus, if spacers are formed on sides of the bit lines so as to perform an SAC process, it becomes more difficult to fill gaps in an interlayer dielectric formed to insulate bit lines.

SUMMARY OF THE INVENTION

The present invention provides a method of manufacturing a semiconductor device, which can reduce loading capacitance between interconnections, sufficiently fill gaps between the interconnections with an insulating layer, and form interconnection contacts in a self-aligned manner and a device thereby formed.

In accordance with one aspect of the present invention, there is provided a method of manufacturing a semiconductor device which can induce a low loading capacitance between interconnections.

The method of the present invention comprises forming a first insulating layer; forming a plurality of stacks each including a bit line and a bit line mask on the first insulating layer; forming a second insulating layer to fill gaps between the plurality of stacks; forming a hard mask layer on the second insulating layer; forming a photoresist pattern on the hard mask layer to have an opening region that intersects the plurality of stacks of the bit lines and the bit line masks; patterning the hard mask layer to form a hard mask and forming a recess, which exposes a portion of upper sidewalls of the bit line mask, in the second insulating layer by sequential etching the hard mask layer and the second insulating layer, using the photoresist pattern as an etch mask; forming spacers on the exposed upper sidewalls of the bit line mask; forming a penetration hole that penetrates a portion of the second insulating layer and a portion of the first insulating layer, which correspond to the bottom of the recess, by etching the portion of the second insulating layer and the portion of the first insulating layer using the spacers, the bit line mask, and the hard mask as an etch mask; forming a conductive layer on the hard mask to fill the penetration hole; and forming an interconnection contact in the penetration hole by node separation of the conductive layer.

The formation of the second insulating layer may further comprise planarizing the second insulating layer until the top surface of the bit line mask is exposed.

The etching process for forming the recess may be a partial etch process that can etch the second insulating layer to a partial thickness so as not to expose the bit line.

The formation of the spacers may comprise removing the photoresist pattern; forming a spacer layer that covers the exposed sidewalls of the bit line mask and extends onto the hard mask; and etching back the spacer layer. Here, the spacer layer may extend also onto the sidewall of the recess so that an additional spacer may be formed on the sidewall of the recess by the etchback process.

The node separation may comprise planarizing the conductive layer until the top surface of the bit line mask is exposed. Here, the planarization process may be carried out using an etchback process or chemical mechanical polishing (CMP). The planarization process may remove even the hard mask.

According to embodiments of the present invention, the loading capacitance between interconnections such as bit lines can be lowered. Also, the gaps between the interconnections can be effectively filled with an insulating layer and an interconnection contact can be formed in a self-aligned manner.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE PREFERRED EMBODIMENTS

Embodiments of the present invention will now be described more fully with reference to the accompanying drawings, in which preferred embodiments of the invention are shown. In the embodiments of the present invention, a loading capacitance between interconnections, i.e., bit lines, can be reduced and gaps between the interconnections can be effectively filled with an insulating layer. Also, an interconnection contact can be formed in a self-aligned manner.

To form the self-aligned interconnection contact with a reduced loading capacitance, a bit line mask is formed on a bit line, and top spacers are formed on upper sides of the bit line mask. Also, to lower the loading capacitance and to enhance a gap filling characteristic of an insulating layer, the bit line mask is formed and then gaps between bit lines are filled with an insulating layer before spacers are formed.

Also, when the gaps between the bit lines are selectively opened to form the top spacers and an interconnection contact extending through an insulating layer formed between the bit lines, a hard mask and/or a photoresist pattern with an opening region such as a bar-type opening region crossing over a plurality of bit lines are formed. This helps overcome restrictions of photolithography and etch processes due to a reduction in the design rules.

FIGS. 1 through 3, 4A and 4B, and 5 through 11 are schematic views illustrating a method of manufacturing a semiconductor device with interconnections and interconnection contacts according to an embodiment of the present invention.

Figure 1:
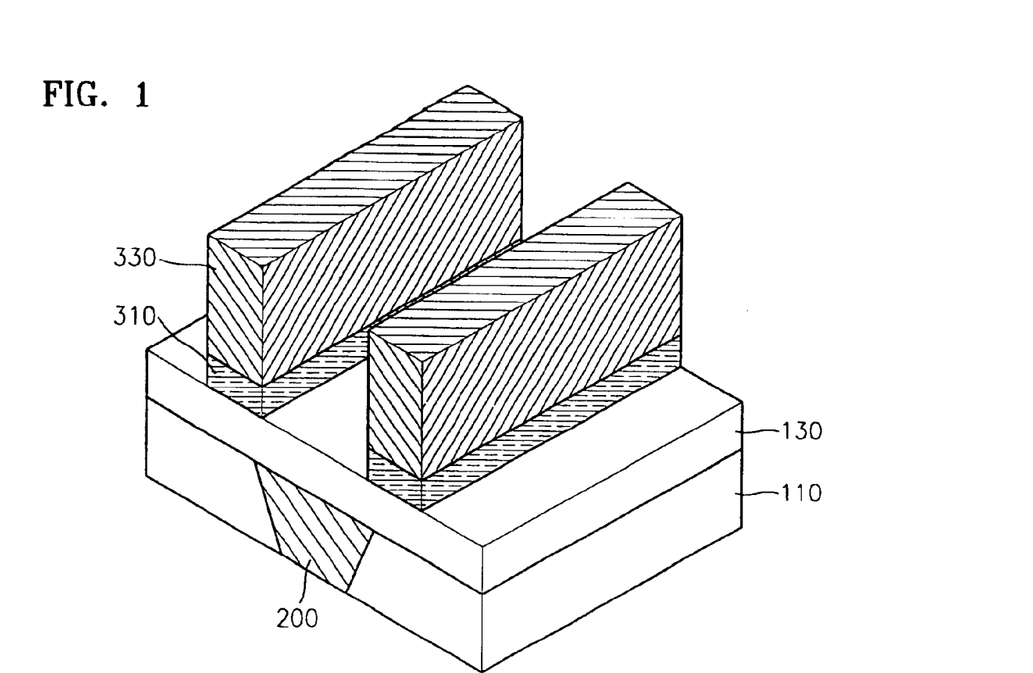
FIG. 1 is a schematic perspective view showing formation of bit lines.

Referring to FIG. 1, a bit line 310 is formed using a conventional technique. For simplicity, the following process steps will be described in connection with an exemplary method of manufacturing a Capacitor Over Bit line (COB)-type DRAM semiconductor device. Although not shown in the drawings, it is thus assumed that the bit line 310 is formed on a semiconductor substrate so as to manufacture the COB-type DRAM semiconductor device.

In a COB-type DRAM semiconductor device, before the bit line 310 is formed, a device isolation process is carried out to define active regions on a semiconductor substrate, e.g., a silicon substrate. Also, the bit line 310 is formed before the formation of a transistor. Before the bit line 310 is formed, a first insulating layer 110 is formed to cover and to insulate a gate electrode (not shown).

The first insulating 110 can be formed by depositing, for example, a silicon oxide layer, which is typically used as an insulating material for manufacturing a semiconductor device. The first insulating layer 110 may be planarized using a conventional planarization technique such as a chemical mechanical polishing (CMP) process. Next, contact pads are formed extending through the planarized first insulating layer 110. The contact pads are electrically connected to active regions of the semiconductor substrate.

The contact pads include a first contact pad (not shown), e.g., a direct contact (DC) pad, which is electrically connected to the bit line 310 and a second contact pad 200, e.g., a buried contact (BC) pad, which is electrically connected to a capacitor, which will be formed as a COB type on the bit line 310. The contact pads including the second contact pad 200 are formed substantially in a lengthwise direction of the gate electrode using conventional techniques such as a photolithography process, a etching process to form a contact hole, a process of depositing a conductive layer, and a node separation process.

Thereafter, a second insulating layer 130 is formed on the first insulating layer 110 including the second contact pad 200 to electrically insulate the second contact pad 200 from the bit line 310. The second insulating layer 130 may be formed by depositing a silicon oxide layer.

Next, a contact hole (not shown) is formed to form a first contact (i.e., a DC) to electrically connect with the bit line 310 and the first contact pad (i.e., the DC pad). Next, the DC is formed by filling the contact hole with a first conductive layer. The first conductive layer is patterned to complete the bit line 310. Although the first contact can be formed at the same time as the bit line 310, it may be formed through a separate process.

Before the bit line 310 is patterned, a bit line mask layer is formed on the first conductive layer. The bit line mask layer may be formed to a thickness of about 300 Å to about 4000 Å. While the bit line 310 is being patterned, the bit line mask layer is patterned along with the first conductive layer to form a bit line mask 330 on the bit line 310. The bit line mask 330 is formed to facilitate the formation of a second contact, i.e., a BC, using a SAC process. The second contact electrically connects with the second contact pad 200 and a capacitor. Accordingly, the bit line mask 330 is preferably formed using an insulating material (e.g., silicon nitride) having a sufficient etch selectivity with respect to silicon oxide.

Figure 2:
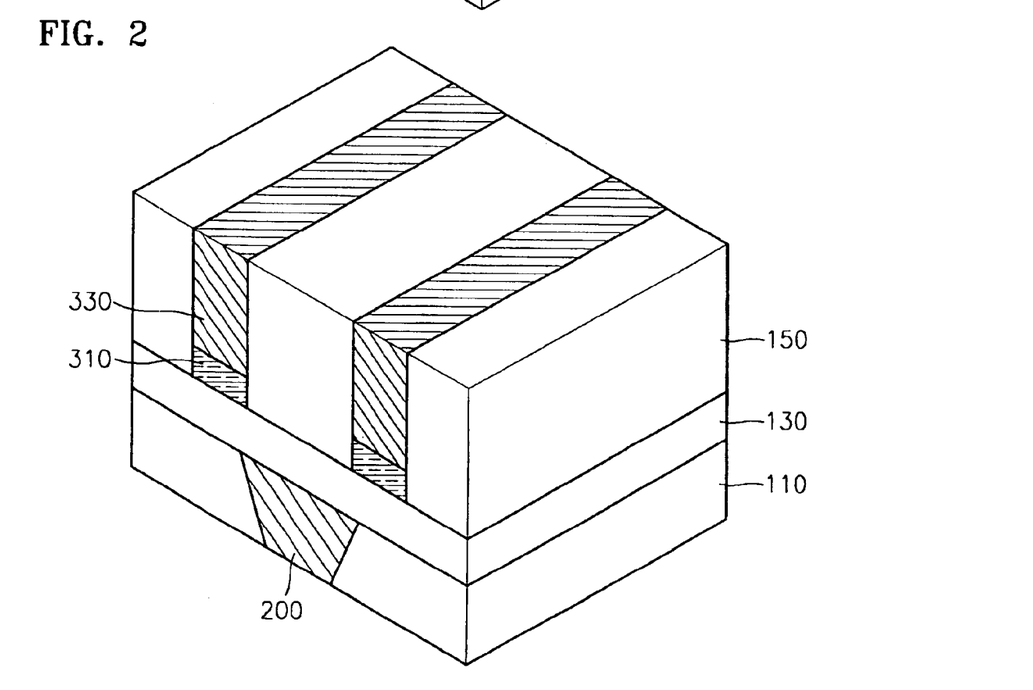
FIG. 2 is a schematic perspective view illustrating formation of a third insulating layer.

FIG. 2 is a schematic perspective view illustrating formation of a third insulating layer 150 that fills gaps between the bit lines 310.

Referring to FIG. 2, the third insulating layer 150 is formed on the second insulating layer 130 exposed between the bit lines 310 so as to fill the gaps between the bit lines 310. The third insulating layer 150 can be formed by depositing a silicon oxide layer to a thickness of about 500 Å to 1000 Å. In this case, the gaps between the bit lines 320 are wider compared to a case where spacers are formed on sidewalls of the bit lines 310. Thus, generation of voids can be prevented during deposition of the third insulating layer 150. Thus, a larger process margin for the voids can be secured.

The third insulating layer 150 is then planarized, until the top surface of the bit line mask 330 is exposed using conventional techniques such as a CMP process.

Figure 3:
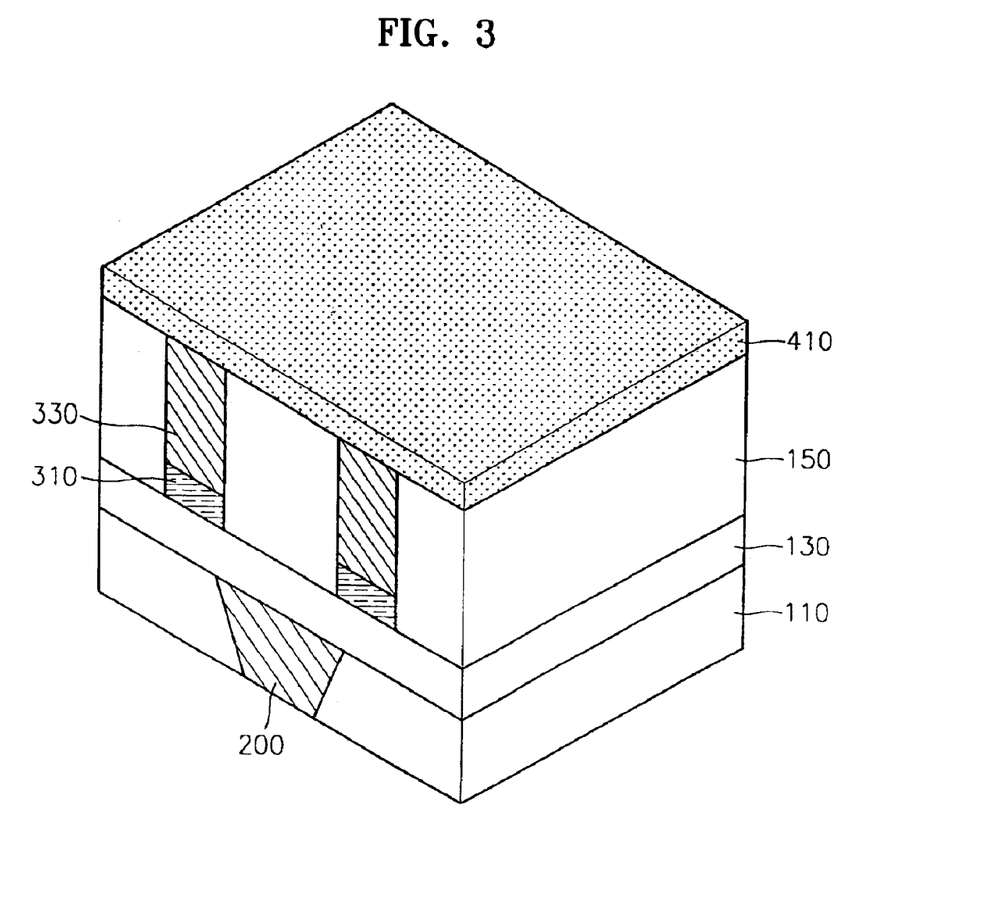
FIG. 3 is a schematic perspective view illustrating formation of a hard mask layer.

FIG. 3 is a schematic perspective view illustrating formation of a hard mask layer 410. Referring to FIG. 3, a hard mask layer 410 is formed on the bit line mask 300 and the third insulating layer 150. The hard mask 410 is formed to form a hard mask, which will be used as an etch mask during subsequent etching of the third insulating layer 150 to form a second contact, i.e., the BC. Thus, the hard mask layer 410 is preferably formed of a material having a sufficient etch selectivity with respect to silicon oxide. For example, polycrystalline silicon ("polysilicon") may be deposited to a thickness of about 100 Å to about 3000 Å.

Figure 4A:
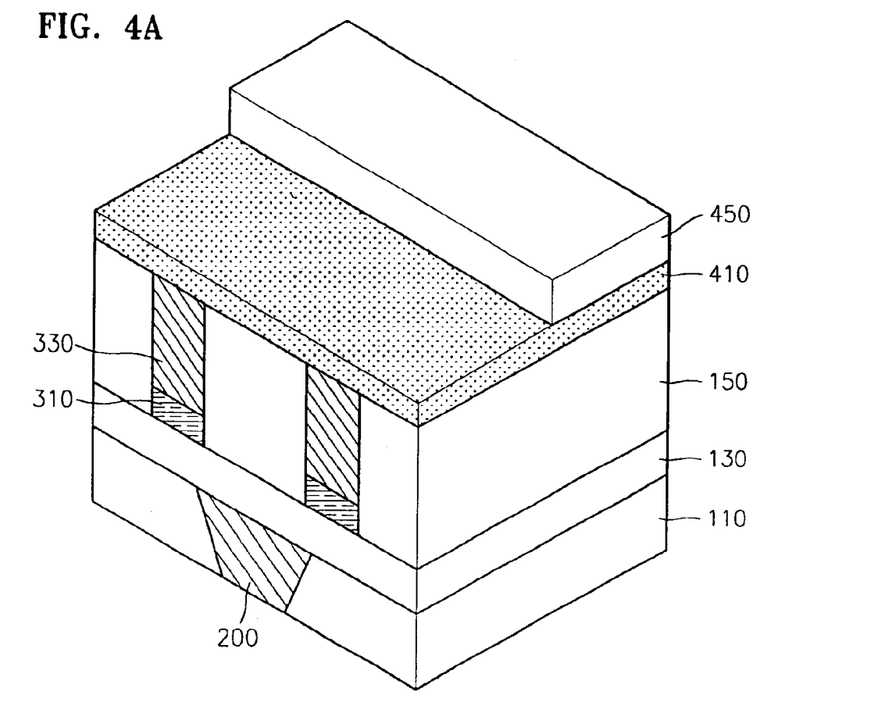
FIGS. 4A and 4B are a schematic perspective view and plan view, respectively, illustrating formation of a photoresist pattern.
Figure 4B:
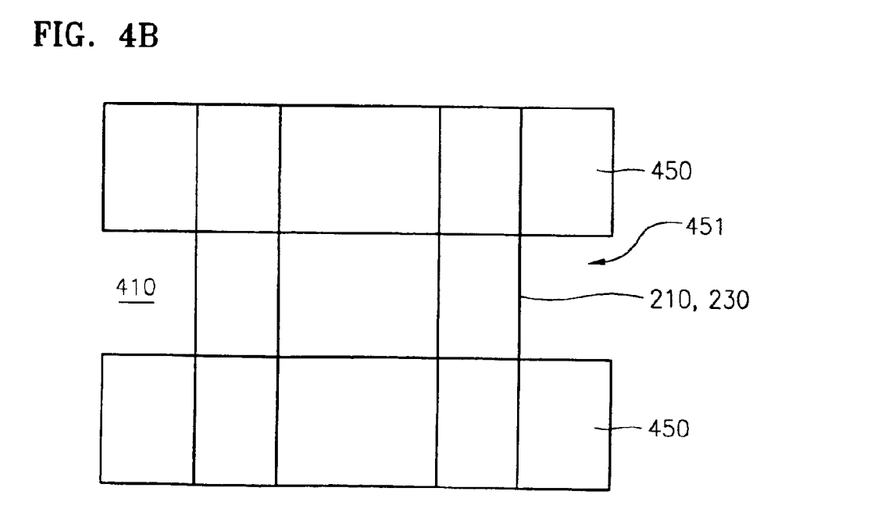

FIGS. 4A and 4B are a schematic perspective view and plan view, respectively, illustrating formation of a photoresist pattern 450 having, for example, a bar-type opening region 451.

Referring to FIGS. 4A and 4B, a photoresist pattern 450 is formed on the hard mask layer 410 to have the bar-type opening region 451 that exposes a portion of the hard mask layer 410. The photoresist pattern 450 is formed such that the opening region 451 overlaps with at least a portion of the second contact pad 200. Thus, the opening region 451 is defined in a bar shape to extend across a plurality of bit lines 310.

Since the photoresist pattern 450 is patterned to have the bar-type opening region 451, a process margin required for a photolithography process for forming the photoresist pattern 450 can be increased. More specifically, with a reduced design rule, it is difficult to form a contact opening for forming the second contact, i.e., the BC due to resolution limits of the current photolithographic process. Therefore, the foregoing photoresist pattern 450 having, for example, the bar-type opening region 451, instead of a conventional contact opening, can be helpful in overcoming the resolution limits of the current photolithographic process. One skilled in the art will appreciate that the present invention is not limited to the above-described embodiment. The opening region 451 can have other shapes other than bar-shape.

Figure 5:
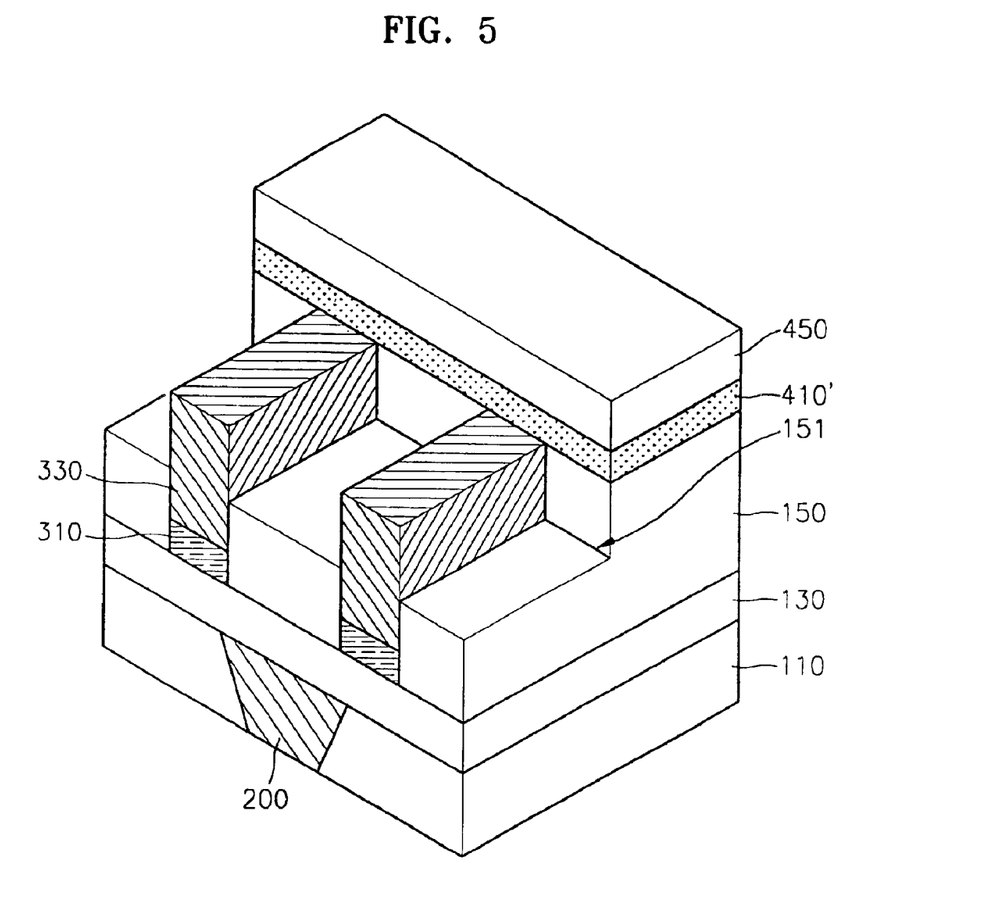
FIG. 5 is a schematic perspective view illustrating formation of a recess in the third insulating layer.

FIG. 5 is a schematic perspective view illustrating formation of a recess 151 in the third insulating layer 150. Referring to FIG. 5, a portion of the hard mask layer 410, which is exposed by the opening region 451 of FIG. 4B, is selectively etched and removed using the photoresist pattern 450 as an etch mask. Thus, the hard mask layer 410 is patterned to be a hard mask 410'. As a result, the hard mask 410' intersects and exposes the bit line masks 330, and also exposes a portion of the third insulating layer 150 between the bit line masks 330.

Next, the exposed portion of the third insulating layer 150 is selectively removed so as to partially recess the third insulating layer 150. Thus, the recess 151, which exposes a portion of upper sidewalls of the bit line mask 330, is formed. An etch process is performed so as to selectively etch a portion of the third insulating layer 150, which is exposed by the hard mask 410' and the bit line mask 330, to a certain depth. Preferably, the partial etch process is performed such that the resulting recess 151 does not expose the bit line 310.

The foregoing etch process is substantially performed to the third insulating layer 150 using an etchant having an etch selectivity with respect to silicon nitride constituting the bit line mask 330.

Figure 6:
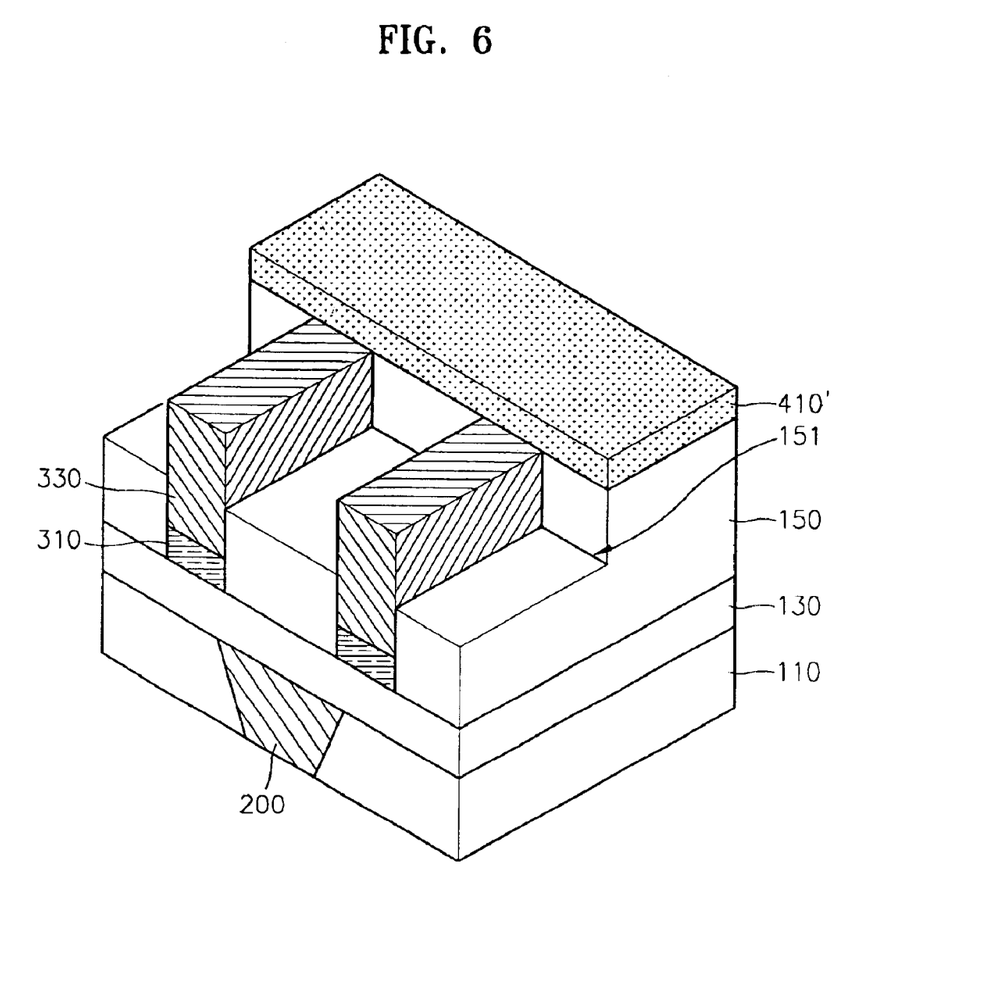
FIG. 6 is a schematic perspective view illustrating removal of a photoresist pattern.

FIG. 6 is a schematic perspective view illustrating removal of the photoresist pattern 450. Referring to FIG. 6, after the recess 151 is formed in the third insulating layer 150 to expose the upper sidewalls of the bit line mask 330, the photoresist pattern 450 is selectively removed using conventional techniques such as ashing and stripping.

Figure 7:
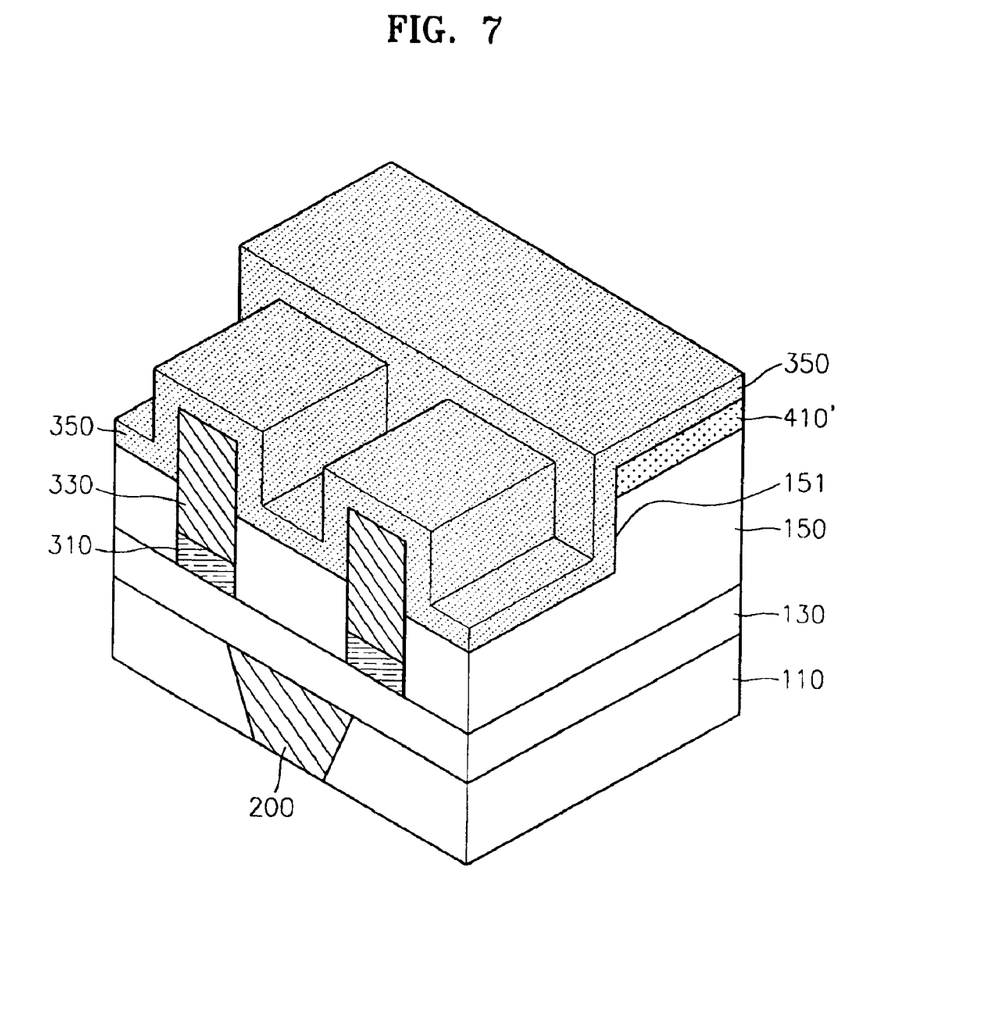
FIG. 7 is a schematic perspective view illustrating formation of a spacer layer.

FIG. 7 is a schematic perspective view illustrating formation of a spacer layer 350 on the exposed sidewalls of the bit line mask 330. Referring to FIG. 7, after the recess 151 is formed, the spacer layer 350 is formed to cover the sidewalls of the bit line mask 330, which are exposed by the partial etch process. The spacer layer 350 is preferably formed of a material (e.g., silicon nitride) having a sufficient etch selectivity with respect to the insulating material (e.g., silicon oxide) that forms the third insulating layer 150. The spacer layer 350 may be formed to a thickness of about 10 Å to about 70 Å.

Because the spacer layer 350 is formed by a deposition process, it extends also to the bottom and sidewalls of the recess 151 and the top of the hard mask 410'.

Figure 8:
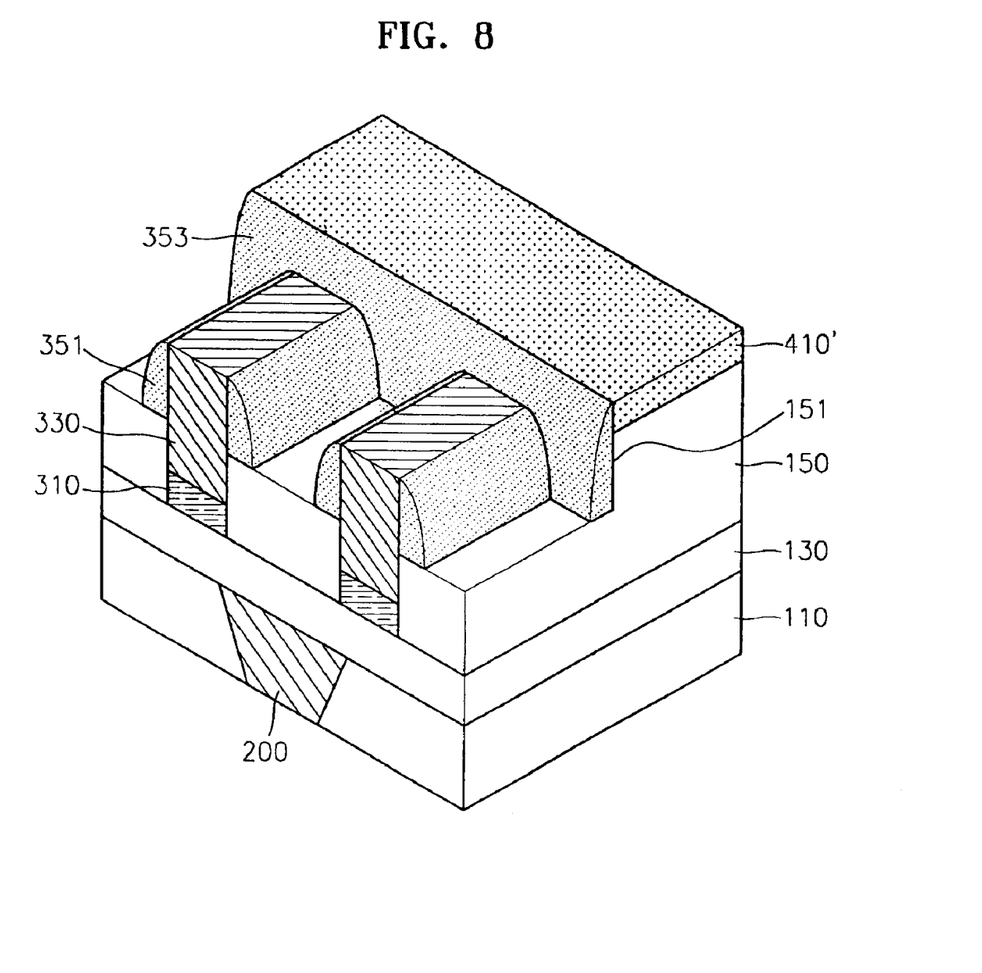
FIG. 8 is a schematic perspective view illustrating formation of spacers.

FIG. 8 is a schematic perspective view illustrating formation of spacers 351 and 353. Referring to FIG. 8, the spacer layer 350 is etched back so that first spacers 351 are formed on the upper sidewalls of the bit line mask 330 and a second spacer 353 is formed on the exposed sidewall of the third insulating layer 150, which corresponds the sidewall of the recess 151. As the spacer layer 350 is etched back using an anisotropic etch process, the first and second spacers 351 and 353 are formed only on the sidewalls. Thus, the top surface of the bit line mask 330 and the surface of a portion of the third insulating layer 150 corresponding to the bottom of the recess 151 are exposed. Because the recess 151 exposes only the upper sidewalls of the bit line mask 330, the first spacers 351 are formed only on the upper sidewalls of the bit line mask 330 ("a top spacer").

Figure 9:
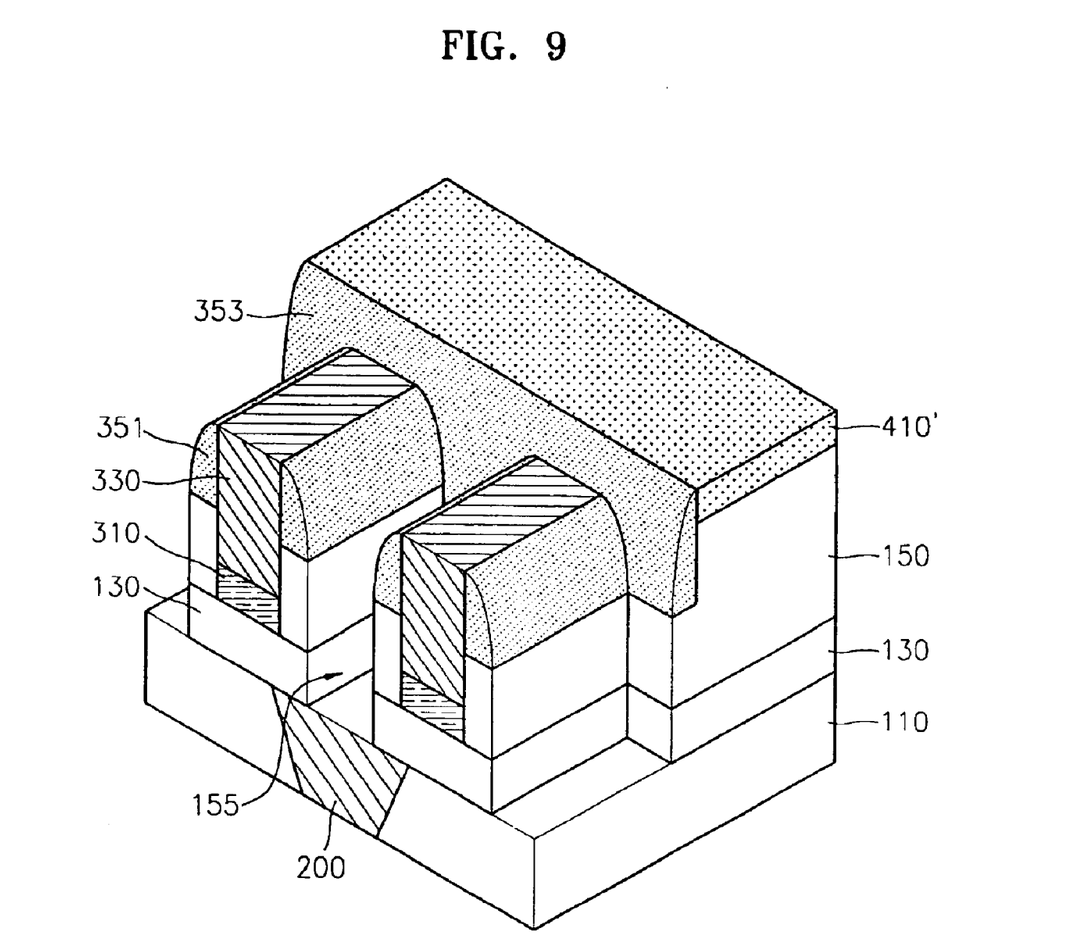
FIG. 9 is a schematic perspective view illustrating formation of a penetration hole.

FIG. 9 is a schematic perspective view illustrating formation of a penetration hole 155 that penetrates the third insulating layer 150 and the second insulating layer 130.

Referring to FIG. 9, the portion of the third insulating layer 150, i.e., the bottom of the recess 151, which is exposed by the first spacers 351, is selectively etched and removed using the first spacers 351 and the hard mask 410' as an etch mask. The etch process continues until the penetration hole 155 is formed to penetrate the third insulating layer 150 and the second insulating layer 130 disposed thereunder. The second spacer 353, which is formed on the sidewall of the recess 150, can also be used as an etch mask.

In the above-described embodiment, the first and second spacers 351 and 353 may be formed of silicon nitride, and the hard mask 410' may be formed of polysilicon. As is known, the polysilicon and the silicon nitride have a sufficient etch selectivity with respect to silicon oxide of the third insulating layer 150. Therefore, the first and second spacers 351 and 353 and the hard mask layer 410' can function as effective etch masks.

Since the third insulating layer 150 and the second insulating layer 130 are formed using the hard mask layer 410' and the first and second spacers 351 and 353 as etch masks, the penetration hole 155 is formed self-aligned with the hard mask layer 410' and the first and second spacers 351 and 353. The photoresist pattern 450 required for forming the hard mask 410' has the opening region 451, a portion of which overlaps the second contact pad 200. Thus, the penetration hole 155 exposes the top surface of the second contact pad 200 disposed thereunder.

Figure 10:
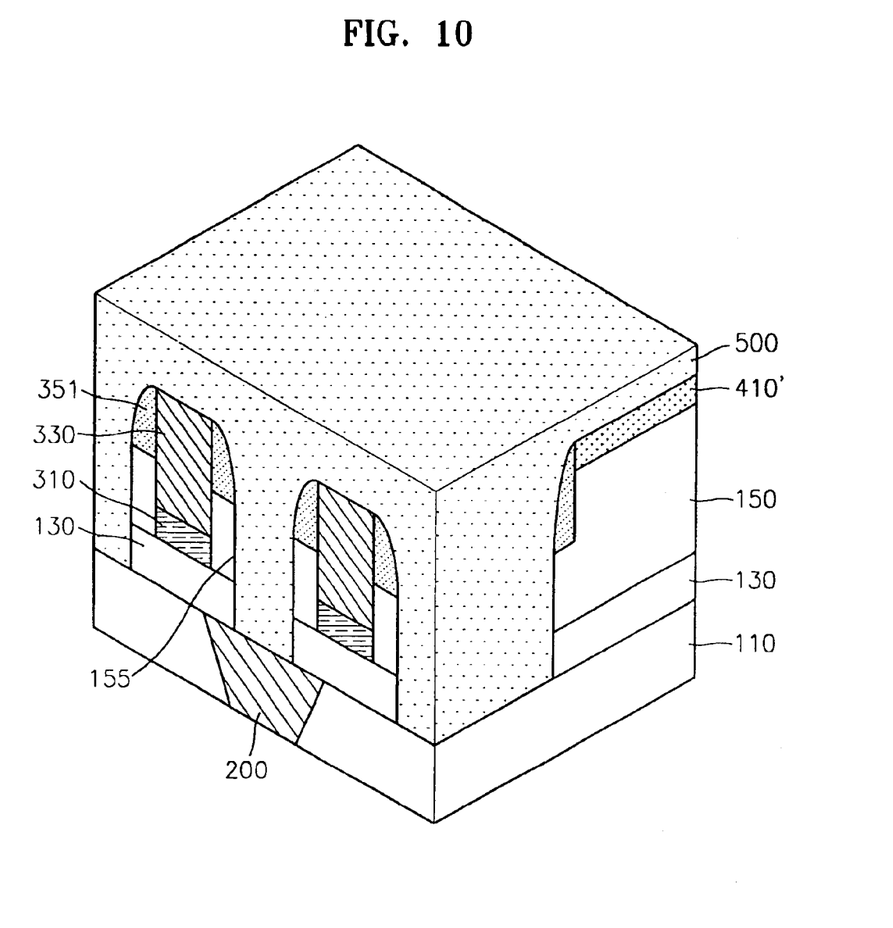
FIG. 10 is a schematic perspective view illustrating formation of a second conductive layer.

FIG. 10 is a schematic perspective view illustrating formation of a second conductive layer 500 that fills the penetration hole 155. Referring to FIG. 10, a second conductive layer 500 is formed on the hard mask 410' to fill the penetration hole 155. By filling the penetration hole 155, the second conductive layer 500 is electrically connected to the second contact pad 200 exposed by the penetration hole 155. The second conductive layer 500 can be formed of various conductive materials. For example, conductive polysilicon may be deposited to form the second conductive layer 500.

Figure 11:
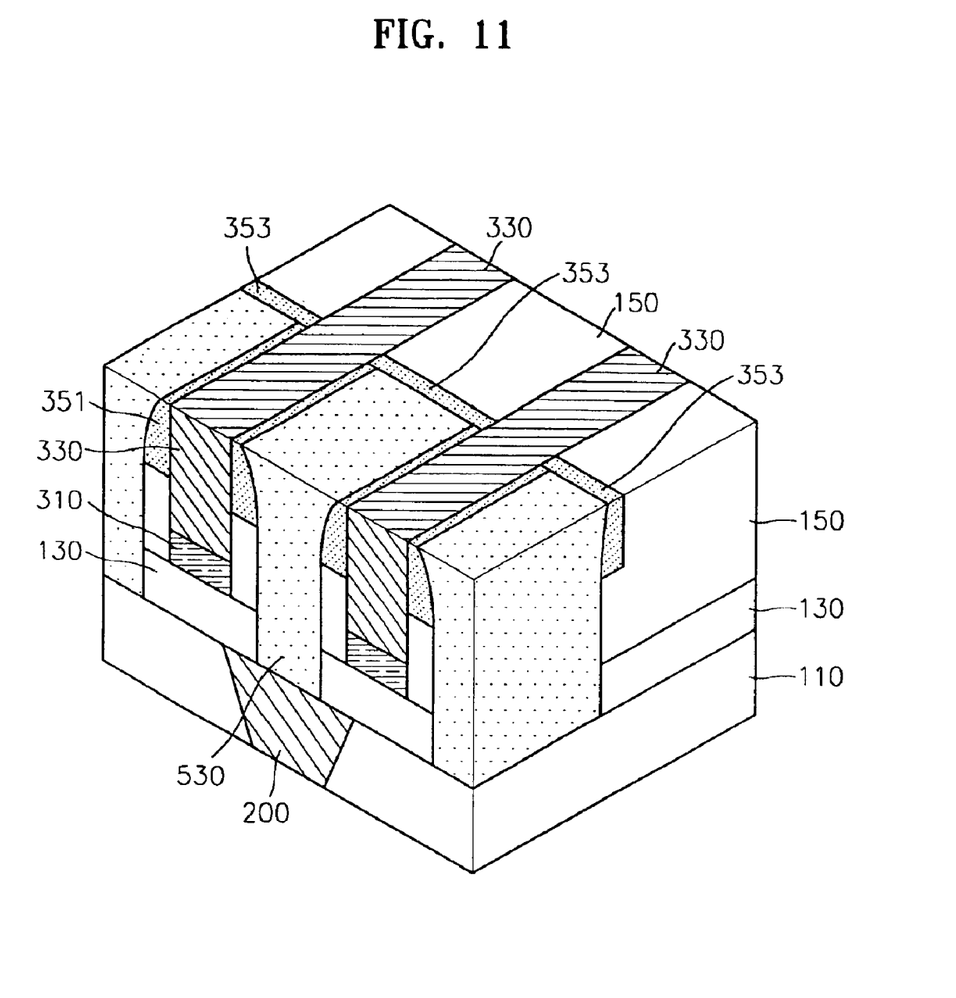
FIG. 11 is a schematic perspective view illustrating formation of an interconnection contact.

FIG. 11 is a schematic perspective view illustrating formation of an interconnection contact 530 in the penetration hole 155 using node separation.

Referring to FIG. 11, the second conductive layer 500 is node-separated using a planarization process, thereby forming the interconnection contact 530 that fills the penetration hole 155. The second conductive layer 500 is planarized using an etchback process or a CMP process until the top surface of the bit line mask 330 is exposed.

Thus, the second conductive layer 500 is node-separated into individual interconnection contacts 530. Meanwhile, during the planarization process, the hard mask 410' also is removed. Since the hard mask 410' and the second conductive layer 500 were preferably formed of polysilicon layers, they may be polished or etched during the planarization process and thus removed.

As a result, a capacitor is formed on the resultant interconnection contact 530 so as to form a COB-type DRAM semiconductor device. Thus, the interconnection contact 530 is electrically connected to the capacitor and the second contact pad 200 disposed thereunder.

Referring again to FIG. 11, the resultant interconnection contact 530 is formed self-aligned with the first spacers 351. Thus, the third insulating layer 150 formed of silicon oxide exists between the interconnection contact 530 and the bit line 310, and the first spacers 351 exist only between the interconnection contact 530 and the bit line mask 330. As a result, since the interconnection contact 530 is formed in a self-aligned manner, an electrical shorting can be effectively prevented between the bit line 310 and the interconnection contact 530.

Referring again to FIG. 2, the third insulating layer 150 is directly deposited in the gaps between the bit lines 310, thus decreasing an aspect ratio between the bit lines 310. Accordingly, generation of voids can be effectively prevented during deposition of the third insulating layer 150 without requiring a separate process.

As explained above, spacers are formed only on upper sidewalls of a bit line mask. With the silicon oxide layer having a relatively low dielectric constant formed near a bit line, an increase in loading capacitance can be effectively reduced. Also, an interconnection contact is formed self-aligned with the spacers, thereby preventing a short between the bit line and the interconnection contact.

Further, before the spacers are formed, an insulating layer is formed to fill gaps between the bit lines. This can prevent generation of voids during deposition of the insulating layer. Also, to expose the sidewalls of the bit line mask, a photoresist pattern with a bar-type opening region is formed so as to expose a plurality of bit lines. As a result, resolution limits of photolithographic and etching processes, for example, in the sub-0.14-$\mu$m regime, can be overcome.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
   forming a first insulating layer having a contact pad formed therein;
   forming a second insulating layer overlying the first insulating layer;
   forming a plurality of stacks each including a bit line and a bit line mask on the second insulating layer;
   forming a third insulating layer overlying the second insulating layer to fill gaps between the plurality of stacks;
   forming a hard mask layer on the third insulating layer;
   forming a photoresist pattern on the hard mask layer, the photoresist pattern having an opening region that intersects the plurality of stacks;
   sequentially etching the hard mask layer and the third insulating layer, using the photoresist pattern as an etching mask, thereby forming a hard mask and forming a recess in the third insulating layer, the recess exposing a portion of upper sidewalls of the bit line mask; and
   forming spacers on the exposed upper sidewalls of the bit line mask.

2. The method of claim 1, further comprising etching the portion of the third insulating layer and the portion of the second insulating layer, using the spacers, the bit line mask, and the hard mask as an etch mask, thereby forming a hole extending through the third insulating layer and the second insulating layer;
   forming an interconnection contact in the hole to be electrically connected to the contact pad.

3. The method of claim 1, wherein the bit line mask is formed of an insulating material having an etch selectivity with respect to the second insulating layer and the third insulating layer.

4. The method of claim 3, wherein the bit line mask is formed of silicon nitride, and the second insulating layer and the third insulating layer are formed of silicon oxide.

5. The method of claim 1, wherein forming the third insulating layer comprises planarizing the third insulating layer until the top surface of the bit line mask is exposed.

6. The method of claim 1, wherein the hard mask is formed of an insulating material having an etch selectivity with respect to the second insulating layer and the third insulating layer.

7. The method of claim 1, wherein the hard mask is formed of polysilicon.

8. The method of claim 1, wherein forming the recess comprises partially etching the third insulating layer to a depth that does not expose the bit line.

9. The method of claim 1, wherein forming spacers comprises:
   removing the photoresist pattern;
   forming a spacer layer on the bit line mask and on the hard mask; and
   etching back the spacer layer.

10. The method of claim 9, wherein the spacer layer extends also onto the sidewalls of the recess so that an additional spacer is formed on the sidewalls of the recess.

11. The method of claim 1, wherein the spacers are formed of an insulating material having an etch selectivity with respect to the second insulating layer and the third insulating layer.

12. The method of claim 11, wherein the spacers are formed of silicon nitride.

13. The method of claim 1, wherein the conductive layer is formed of conductive polysilicon.

14. The method of claim 2, wherein forming an interconnection contact comprises forming a conductive layer on the hard mask and planarizing the conductive layer until the top surface of the bit line mask is exposed.

15. The method of claim 14, wherein planarizing comprises using one of an etchback process and chemical mechanical polishing.

16. The method of claim 14, wherein the planarization process removes the hard mask.

17. The method of claim 1, wherein the shape of the opening is a bar.

18. A semiconductor formed by the method comprising:

forming a first insulating layer having a contact pad formed therein;

forming a second insulating layer overlying the first insulating layer;

forming a plurality of stacks each including a bit line and a bit line mask on the second insulating layer;

forming a third insulating layer overlying the second insulating layer to fill gaps between the plurality of stacks;

forming a hard mask layer on the second insulating layer;

forming a photoresist pattern on the hard mask layer, the photoresist pattern having an opening region that intersects the plurality of stacks;

sequentially etching the hard mask layer and the third insulating layer, using the photoresist pattern as an etching mask, thereby forming a hard mask and forming a recess in the third insulating layer, the recess exposing a portion of upper sidewalls of the bit line mask;

forming spacers on the exposed upper sidewalls of the bit line mask;

etching the portion of the third insulating layer and the portion of the second insulating layer, using the spacers, the bit line mask, and the hard mask as an etch mask, thereby forming a hole extending through the third insulating layer and the second insulating layer; and forming an interconnection contact in the hole to be electrically connected to the contact pad.

* * * * *